United States Patent [19]

McSparran et al.

[11] Patent Number: 4,658,334
[45] Date of Patent: Apr. 14, 1987

[54] RF SIGNAL SHIELDING ENCLOSURE OF ELECTRONIC SYSTEMS

[75] Inventors: Joseph F. McSparran; William Blackman, both of Cherry Hill, N.J.; Harry Z. Weaver, Newtown, Pa.; Jere W. O'Neill, Succasunna, N.J.

[73] Assignee: RCA Corporation, Princeton, N.J.

[21] Appl. No.: 841,453

[22] Filed: Mar. 19, 1986

[51] Int. Cl.⁴ .............................................. H05K 1/14
[52] U.S. Cl. .................. 361/415; 174/35 R; 174/68.5; 361/414
[58] Field of Search .............................. 361/414, 415; 174/52 FP, 35 R, 68.5

[56] References Cited

U.S. PATENT DOCUMENTS

| | | | |
|---|---|---|---|
| 2,932,806 | 4/1960 | Burr, Jr. | 333/98 |
| 3,022,448 | 2/1962 | Mason | 174/68.5 X |
| 3,255,426 | 6/1966 | Butler | 333/84 |
| 3,533,023 | 10/1970 | Friend et al. | 361/414 X |
| 3,568,000 | 3/1971 | D'Aboville et al. | 361/414 |
| 3,568,312 | 3/1971 | Perricone | 174/68.5 X |
| 3,680,005 | 7/1972 | Jorgensen et al. | 361/414 X |
| 4,021,813 | 5/1977 | Black et al. | 343/788 |
| 4,063,246 | 12/1977 | Greiser | 343/700 MS |
| 4,078,237 | 3/1978 | Kaloi | 343/700 MS |
| 4,095,227 | 6/1978 | Kaloi | 343/700 MS |
| 4,110,751 | 8/1978 | Reggia et al. | 343/700 MS |
| 4,170,013 | 10/1979 | Black | 343/700 MS |
| 4,370,700 | 1/1983 | Duddles et al. | 174/35 R X |
| 4,437,140 | 3/1984 | Ohyama et al. | 361/402 |
| 4,494,095 | 6/1985 | Noji et al. | 174/35 R |
| 4,498,122 | 2/1985 | Rainal | 361/414 |
| 4,513,266 | 4/1985 | Ishihara | 333/238 |
| 4,551,747 | 11/1985 | Gilbert et al. | 361/414 X |

OTHER PUBLICATIONS

RCA Technical Note 1295, Jan. 28, 1982, by: Robert Jean Mason, "Stripline Transmission Line Isolation".
RCA Technical Note No. 189, "Radio Interference Gasket" by: Donald E. Yates et al.

Primary Examiner—R. R. Kucia
Attorney, Agent, or Firm—Joseph S. Tripoli; Robert L. Troike; Robert Ochis

[57] ABSTRACT

An enclosure for electronic systems provides substantially total RF isolation of separate segments of a system except for the transmission of desired signals between different segments, even though the various segments are fabricated on a common circuit board. A special multilayer circuit board configuration makes this isolation feasible. Buffer circuits connected to drive signals on and receive signals from conductors which extend between isolated compartments prevent communication of stray signals along those conductors.

19 Claims, 7 Drawing Figures

RF SIGNAL SHIELDING ENCLOSURE OF ELECTRONIC SYSTEMS

The Government has rights in this invention pursuant to Contract No. MDA904-83-C-0499 awarded by the U.S. Government.

BACKGROUND OF THE INVENTION

The present invention relates to electronic systems and more particularly to system configurations which provide RF isolation and shielding among various segments of such systems.

There are many electronic systems and subsystems in which it is important to prevent the coupling of RF signals between different, sensitive segments of the system or subsystem in order to prevent undesired oscillations, misapplication of signals and interference between different signals. Hereinafter, the term system is used to include both systems and subsystems. Such systems include high gain amplifiers such as intermediate frequency IF amplifiers in communication systems; other systems which are sensitive to noise such as low signal amplitude, high gain preamplifiers; systems in which control signal leakage or contamination can cause undesired system operation; and other systems where contamination of one signal by another must be prevented. Many systems which are only moderately sensitive to the coupling of RF signals are fabricated in a single enclosure. However, systems which are particularly sensitive to interfering RF signals are normally designed and manufactured with the sensitive segments in physically separate enclosures which are interconnected by shielded cables in order to provide the required RF isolation among them.

In particular, the primary technique used to obtain RF isolation in highly RF sensitive systems is to place each sensitive circuit segment on its own printed circuit board and to place that circuit board in an individual shielding enclosure to isolate it from other system segments.

It is known in strip transmission line structures in which a conductor is suspended between two ground planes to use a row of conductive rods which extend between the ground planes to RF shield an individual conductor from other conductors.

In recent years a need has developed for the fabrication of compact lightweight systems for use in aircraft, in space and in other locations where space and weight capacity are severely limited. The prior art technique of obtaining RF isolation via physical separation in individual enclosures is largely incompatible with the need for compact, lightweight systems. In the past, it has been necessary to accept increased size and weight in exchange for obtaining high RF isolation among system segments.

It is desirable to provide electronic systems which ensure complete RF isolation of selected system segments from each other while allowing the system to be fabricated in a compact, unitary manner.

SUMMARY

The present invention provides a system configuration and package for electronic systems which meets this need. A segment of an electronic system is fabricated on a single multilayer circuit board in a manner which provides it with essentially complete RF isolation from external signals. This RF isolated segments of the system is fabricated in and on an RF isolated circuit zone of this circuit board. This multilayer circuit board includes a plurality of conductive layers interleaved with electrically insulating dielectric layers. One of its internal conductive layers comprises a substantially continuous planar ground layer. Each of the other conductive layers is referred to as a signal layer and at least some of the signal layers comprise relatively narrow signal conductors. A shielding structure is built into the circuit board to provide RF isolation of the circuit zone and thus its segment of the electronic system. This shielding structure includes, in each signal layer, a shielding band, surrounding the circuit zone. Each of these shielding bands is directly connected to the ground layer by a plurality of conductive members which extend through the dielectric layers to contact the ground conductor and the shielding band of each of the signal layers. These conductive members hold the shielding bands of the signal layers at ground potential and comprise a conductive, ground potential, picket fence within each of the dielectric layers which encircles the circuit zone to provide RF shielding of the circuit segment therein.

This circuit board and the electrical components mounted thereon are enclosed in a mating electrically conductive housing. This housing is comprised of individual conductive housing members which have a recess adjacent to the circuit zone. A contact face of each housing member mates with the shielding band of the outermost signal layer on the side of the circuit board adjacent thereto to provide electrical continuity between the housing and the circuit board's internal shielding structure. The housing members are secured to each other and the circuit board to provide a tight seal with the board and thereby enclose the circuit zone in its own RF isolated compartment. Conductors which must connect the RF isolated circuit zone to the region external thereto are disposed in signal layers which are adjacent to the ground layer and are preferably provided with driver and receiver buffer circuits which prevent the transmission of stray signals along with or as part of the signals it is intended to transmit.

A complete system may include a plurality of such RF isolated circuit zones in a single circuit board. In such a multizone circuit board the shielding band of each signal layer has an opening therein for each circuit zone and each isolated zone is preferably encircled by its own shielding picket fence of conductive members which contact the ground layer and the shielding band of each signal layer. The housing members have separate recesses for each isolated circuit zone and contact faces which mate with the outermost shielding band adjacent thereto to isolate the individual circuit zones in their own compartments.

More complex systems may include additional circuit boards within their housing with the circuit boards isolated from each other as necessary by separator housing members disposed between adjacent printed circuit boards. Such separator housing members have recesses and contact faces on both of their major surfaces which mate with the circuit boards adjacent thereto thereby providing separate enclosures as needed.

DETAILED DESCRIPTION

Figure 1:
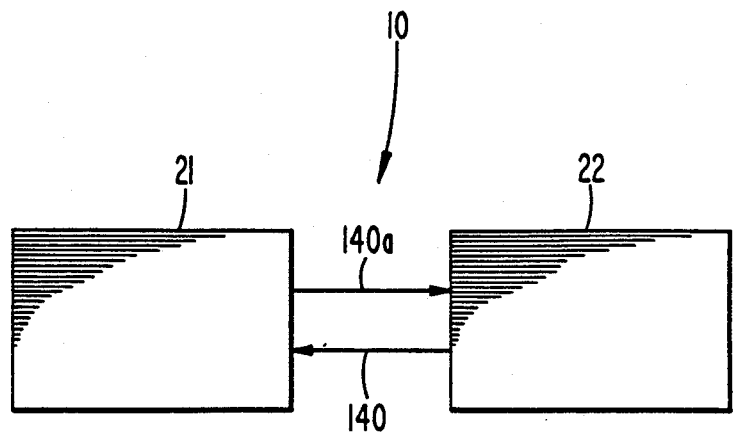
FIG. 1 is a block diagram of an electrical system including subsystems which must be isolated from each other.
Figure 2:
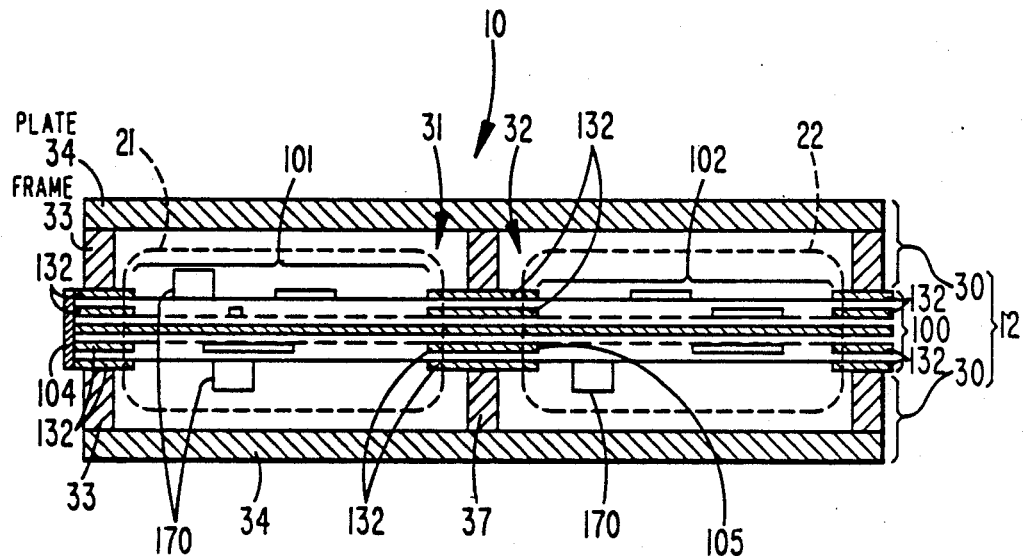
FIG. 2 is a cross sectional view of the system of FIG. 1 enclosed in a housing in accordance with the present invention.

An electronic system 10 in accordance with the present invention which is shown in block form in FIG. 1 comprises separate segments 21 and 22 which are in RF communication along circuit paths such as 140 and 140a, but are otherwise RF isolated. In accordance with the present invention, the system 10 may be fabricated on a single circuit board enclosed within a single housing which provides complete RF isolation of the segments 21 and 22 except along desired circuit paths such as 140 and 140a. FIG. 2 is a cross section through system 10 fabricated in accordance with this invention. In FIG. 2, system 10 comprises electronic components 170 mounted to a multilayer circuit board 100 within a multipiece electrically conductive housing 12. The housing 12 and the circuit board 100 together create two laterally spaced compartments 31 and 32 in which RF isolated segments 21 and 22, respectively, are located. Housing 12 and circuit board 100 are specially configured in a manner to be described which enables total RF isolation of compartment 31 from compartment 32 even though circuit board 100 extends between them. Circuit board 100 includes two separate laterally spaced circuit zones 101 and 102 (FIGS. 2-5) which are located, respectively within compartments 31 and 32. Circuit board 100 extends between these compartments, but a shielding structure or system 130 (FIG. 3) included therein spaces the circuit zones 101 and 102 apart physically and RF isolates them to prevent undesired transmission of RF signals between those compartments through the circuit board 100. The first RF isolated segment 21 of the electronic system 10 is fabricated in and on the circuit zone 101 and contained within compartment 31. The second RF isolated segment 22 of system 10 is fabricated in and on the circuit zone 102 and contained within compartment 32. When secured in assembled relation as shown in FIG. 2, the housing 12 and the circuit board 100 co-act to form a single compact, rugged and light-weight enclosure which RF isolates segments 21 and 22.

In this specification, the term "circuit board" is used as a generic term for printed circuit boards, printed wiring boards, multiwire boards and other types of substantially planar structures which provide interconnection among electronic components mounted thereon. The term "signal conductor" means a conductor in one of the conductive layers of a circuit board which selectively connects two or more circuit points. The term "circuit zone" refers to a region of the circuit board on which the components of one of the system segments are mounted and in which the signal conductors interconnecting those components are located. A circuit zone extends through the entire thickness of the circuit board and is bounded laterally by the shielding system 130.

This description now proceeds with a brief general description of those aspects of the internal structure of circuit board 100 which are involved in the shielding system 130. It then proceeds with a more detailed description of shielding system 130. That in turn is followed by a description of the housing 12 and its components and their co-action with shielding system 130 to create the RF isolated compartment.

Figure 3:
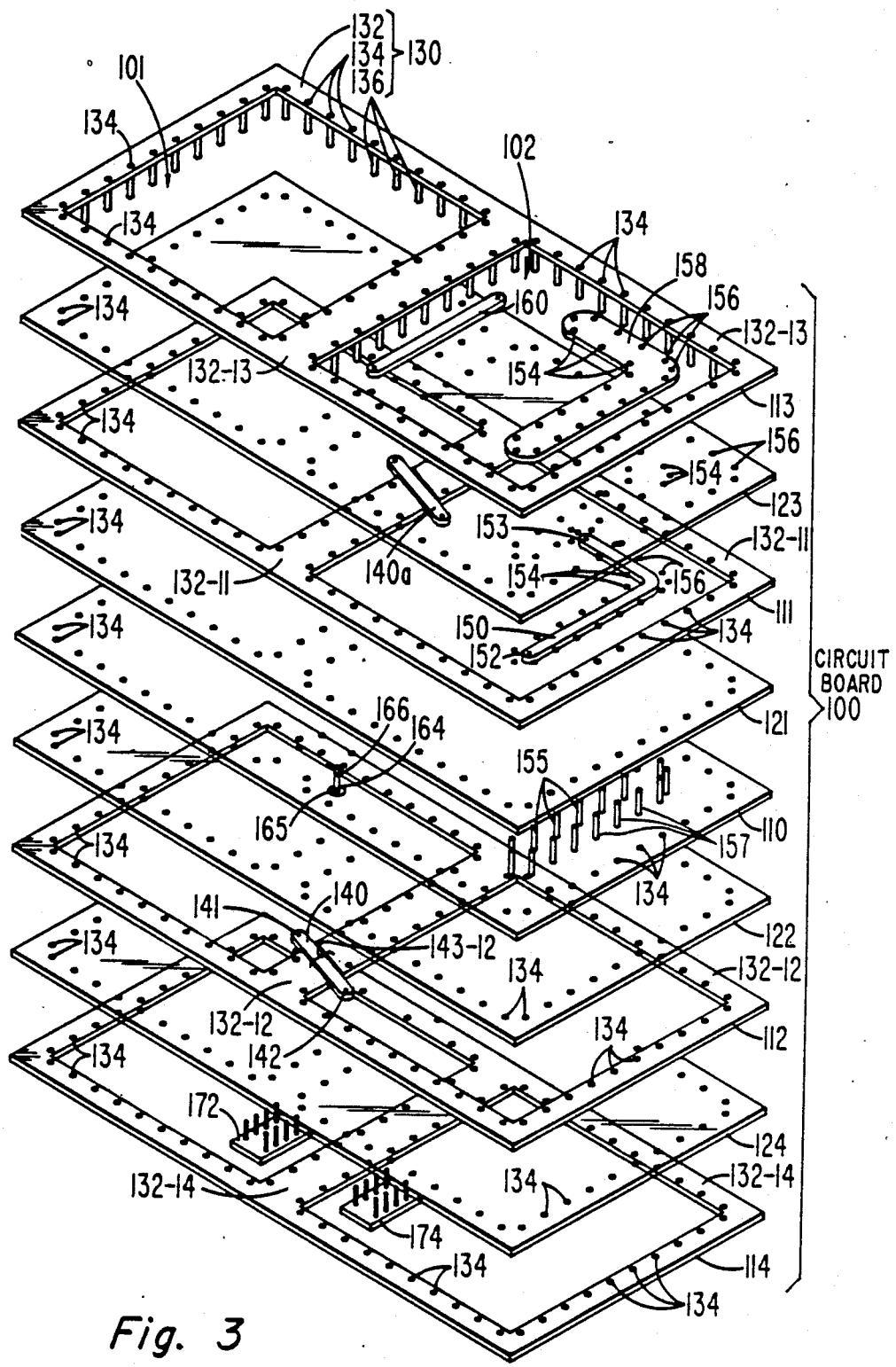
FIG. 3 is a perspective, exploded view of the circuit board in FIG. 2.

The circuit board 100 as shown in the exploded, perspective view in FIG. 3 comprises a plurality of separate layers 110-114 of conductive material which are spaced apart from each other by intervening layers 121-124 of dielectric material. For clarity of the drawing, the dielectric layers 121-124 are shown as being transparent. The dielectric layers 121-124 insulate the various conductive layers from each other everywhere except at selected points where separate additional conductive members (such as 136, 155, 157 and 166 to be discussed subsequently) extend through one or more of the dielectric layers to electrically connect portions of two or more of the conductive layers. The central conductive layer 110 serves as a ground plane or ground layer, and extends across the entire circuit board and is uninterrupted except for a plurality of holes, 134 and 164 through which conductive members such as 136 and 166, respectively, extend. The other conductive layers 111-114 are referred to as signal or circuit layers since their primary function is to provide the signal carrying conductors which comprise the circuit of the electronic system fabricated on circuit board 100. Within a circuit zone, each of the signal layers, rather than being a single continuous conductor as in the ground layer 110, comprises separate signal carrying conductors as required by the circuit of the circuit segment therein. If the circuit board 100 is fabricated from a plurality of metalized dielectric layers, then within a circuit zone, a signal layer has most of its conductive material removed in the process of forming the separate signal conductors therein.

Shielding system 130 of circuit board 100 includes a separate shielding band or border of conductive material 132 in each of the signal layers. In the Figures the individual shielding bands or borders 132 are identified as 132-11 for signal layer 111, 132-12 for signal layer 112, 132-13 for signal layer 113 and 132-14 for signal layer 114 in order that they may be separately referred to in a later portion of this specification. However, at this time they are referred to collectively as shielding bands 132 since they have the same size, shape and purpose and the details of the differences in their individual structures are not significant to this part of the description.

Each of the shielding bands 132 extends completely around each of the circuit zones (101 and 102) in its own signal layer. A plurality of holes 134 extend through each of the shielding bands 132, the ground layer 110 and all of the dielectric layers (121-124) of the multilayer circuit board 100. The holes 134 are preferably drilled after lamination of the circuit board to ensure vertical holes (in FIG. 3) which are of uniform size. A conductive member or pin 136 is provided in each of the holes. Each pin 136 extends vertically from uppermost shielding band 132-13 to the lower most shielding band 132-14 and electrically contacts each of the shielding bands 132 and the ground plane layer 110. The conductive pins 136 may be individually inserted pins or rods.

Alternatively, and preferably, conductive plating on the entire interior surfaces of the holes may be used to form all of these conductive members simultaneously. Plating of the interior surface of the holes is preferred because it provides more reliable connection to the conductive layers and minimizes fabrication steps by avoiding the mechanical steps involved in inserting a multitude of individual pins or rods.

Figure 4:
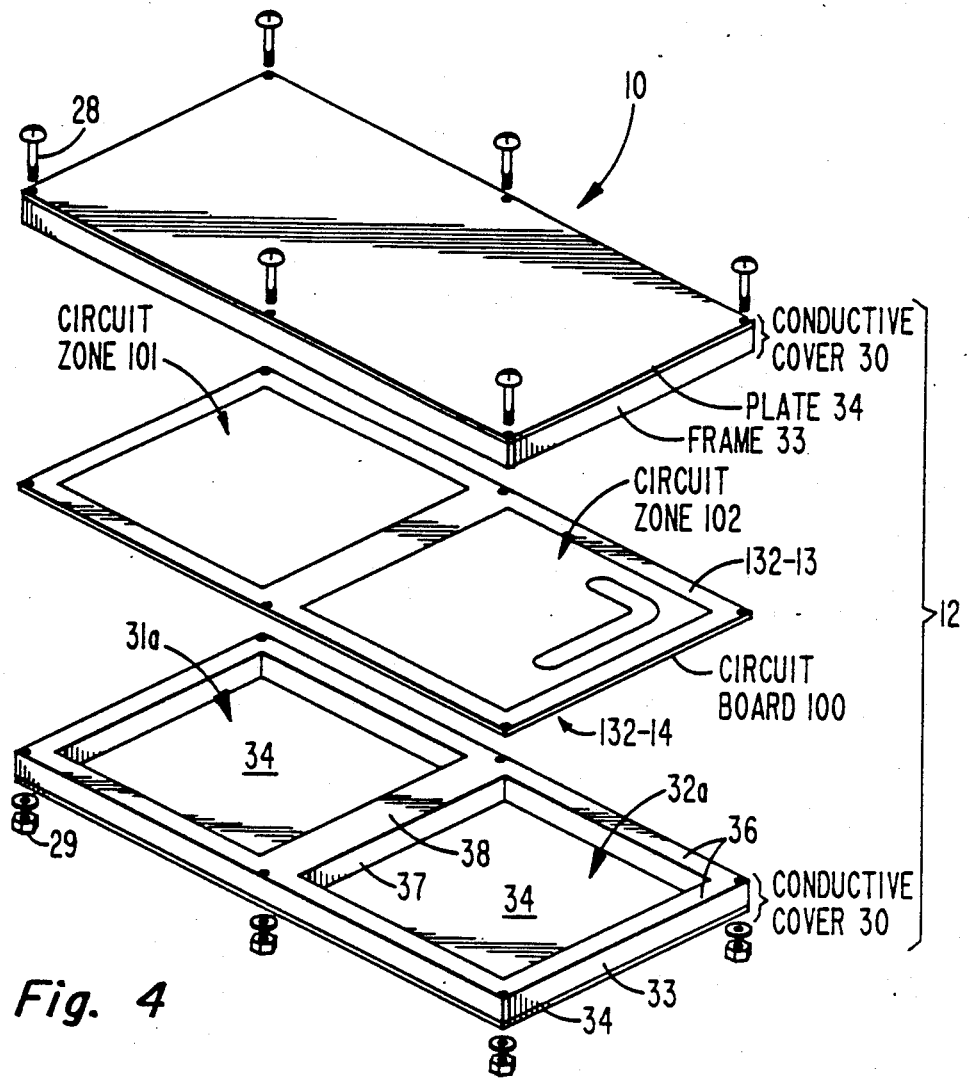
FIG. 4 is a perspective, exploded view of the components of the enclosure in FIG. 2.

In FIG. 4 the enclosure 12 is illustrated in and exploded view to better illustrate the relationship between the structure of the housing members or conductive covers 30 and the shielding system 130 of the circuit board 100. The housing members or covers 30 are identical and each includes a frame 33 which mates with the shielding bands 132 of circuit board surface adjacent thereto and a plate 34 which closes the side of the frame 33 which is away from the circuit board 100. This creates two recesses or wells 31a and 32a in the cover 30 which face toward the circuit board 100 when assembled. These recesses are separated from each other by cross member 37 of frame 33. When the enclosure is assembled as shown in cross-section in FIG. 2, the recesses or wells 31a and 32a form portions of the compartments 31 and 32, respectively, and provide space within these compartments for the electronic components of system segments 21 and 22. The frames 33 have substantially planar contact faces 36 whose outline mates with the adjacent outer shielding band 132 of the circuit board. For the two equal-sized compartments shown in FIGS. 2-5, the contact face 36 have the general configuration of a squared-off figure eight and include a central cross member 37 in order to surround each of the recesses (31a and 32a) individually. The cross member 37 has a surface 38 which is part of the contact face 36 of the cover 30. Although the covers 30 are shown as two piece structures for drawing clarity, each cover may preferably be cast as, or milled from, a solid block to make the plate 34 integral with frame 33 to ensure good electrical contact along the entire joint between the plate 34 and the frame 33.

When the covers 30 are assembled to the circuit board 100 with fasteners such as bolts 28 and nuts 29 (FIG. 4), the contact faces 36 are brought into intimate electrical contact with the shielding bands 132-13 and 132-14 of the outermost signal layers 113 and 114, respectively, of circuit board 100. This makes the housing members 30 electrically continuous with the shielding structure 130 of the circuit board 100. This creates the two separate RF isolated compartments 31 and 32 in which the two separate segments 21 and 22 of the electronic system 10 are placed without causing RF signal leakage between them.

Both the shielding bands 132 and the conductive members 136 of the shelding system 130 are necessary in order to provide this RF isolation. The conductive pins or members 136 are positioned sufficiently close together (closer than about every $\frac{1}{8}$ wavelength) to form an RF shield or barrier at expected RF frequencies to prevent communication of leakage and stray RF signals from compartment 31 to compartment 32 through the circuit board 100 at frequencies of concern and to prevent propagation inward or outward through the exterior edges of the circuit board.

That is, unintentional coupling of signals is prevented between regions which are spaced by the shielding structure of circuit board 100.

Thus, the separation distances between adjacent pins 136 is reduced as the expected frequency of operation increases. If desired, the external (peripheral) edges of the circuit board 100 may be plated or otherwise covered with a conductive layer 104 (FIG. 2) to provide a continuous conductive shield or barrier along the external surface.

The enclosure 12 when fabricated with strong, rigid metal covers 30 provides a shock resistant enclosure for the electronic system 10. In addition to providing RF isolation, it provides physical protection for the circuit boards, circuits and components contained therein by preventing twisting and bending of the board 100 in response to stress and mechanical shocks.

This description now turns to a discussion of additional features of the circuit board 100 which aid in providing total RF isolation of compartments 31 and 32 except for signals which are intentionally transmitted from one compartment to the other.

Figure 5:
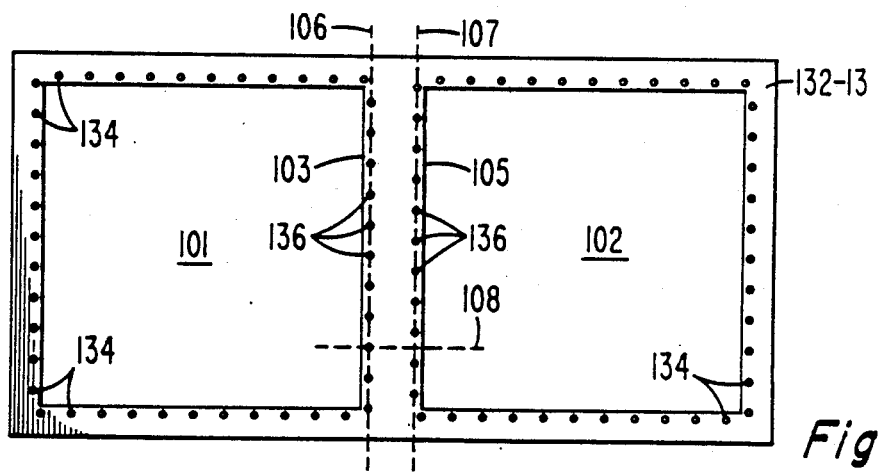
FIG. 5 is a plan view of the circuit board in FIG. 2.

In FIG. 5, the circuit board 100 is shown in plan view. The edge of the circuit zone 101 which is nearest to the circuit zone 102 is identified by the reference numeral 103. Similarly, the edge of the circuit zone 102 which is nearest to circuit zone 101 is identified by the reference numeral 105. The pins 136 are preferably uniformly spaced. Those along the edge 103 are disposed along a straight line (dashed line 106 in FIG. 5) and those along the edge 105 are disposed along another straight line (dashed line 107 in FIG. 5). The line 106 is substantially parallel to the line 107. The dashed line 108 in FIG. 5 is oriented perpendicular to the dashed lines 106 and 107 and extends through one of the pins 136 in the line 106. At the line 107, the line 108 is substantially centered between two adjacent pins 136. Thus, the line 108 bisects the space between two adjacent pins 136 in the line 107. This staggered or offset positioning of the pins of line 106 with respect to the pins of line 107 is preferred as a means of providing additional assurance that undesired RF signals can not propagate between compartments 31 and 32.

Referring to FIG. 3, any signal conductor which extends from within the circuit zone 101 to within the circuit zone 102 in order to transmit desired signals between compartments 31 and 32 is located in one of the two signal layers (111 or 112) which are adjacent to the ground plane layer 110. Such signal conductors shown are in layers 111 and 112 and are labeled 140a and 140, respectively. The conductor 140 extends from a first end 141 in circuit zone 101 to a second end 142 in a circuit zone 102. The conductor 140 passes through a gap 143-12 in the shielding band 132-12 of signal layer 112 to electrically isolate the conductor 140 from that shielding band. The ground continuity of the band 132-12 across the gap 143-12 is maintained by the combination of ground layer 110, the adjacent shielding band 132-14 and the conductive members 136 in contact with the ground layer 110 and the bands 132-12 and 132-14. A conductor between zones 101 and 102 like conductor 140 is placed in either of the layers (111 or 112) which are that adjacent to the ground plane rather than in one of layers (113 and 114) which are remote from ground layer 110 in order to minimize the impedance of the ground loop that conductor creates and to ensure that no other conductor can extend through the ground loop. The impedance of that ground loop is minimized because the conductor, when located in signal layer 111 or 112, has a greater capacitance to ground than it would if it were located in a signal layer which is further from the ground layer 110.

The second conductor (140a) which extends from circuit zone 102 to circuit zone 101 is located in signal layer 111. Thus, the conductors 140 and 140a are shielded from each other by the ground layer 110. This prevents the signal on conductor 140 from coupling to conductor 140a and vice versa. The conductors such as conductors 140 and 140a which extend from one circuit zone to another, are preferably kept as short as possible in order to minimize the area of the resulting ground current loops within each of the compartments.

The end 142 of conductor 140 in layer 112 is electrically connected to a conductor 160 in signal layer 113 by a conductive member or pin 166 which extends from layer 112 through holes in dielectric layers 122, 121 and 123 and a hole 164 in ground layer 110. The hole 164 in ground layer 110 has a larger diameter than the diameter of conductive member 166 in order to provide an electrically insulating gap 165 between conductive member 166 and ground layer 110.

If the integrated circuits (ICs) mounted on circuit board 100 are packaged in dual-in-line-pin (DIP) packages, then other holes in ground layer 110 similar to hole 164 must be provided for the pins (other than ground) of those ICs to extend through. Those pins can provide undesired circuit paths along which RF signals can propagate from below circuit board 100 in FIG. 2 to above that circuit board and vice versa. If surface mounted (leadless) packages are used for the ICs, then only those conductors which are required for desired signal propagation need to extend through holes in the ground layer 110. Thus, when only surface mounted devices are used, four separate RF isolated compartments may be provided with just two circuit zones, since the part of compartment 31 which is above the ground layer in FIG. 2 will be RF isolated from the part of compartment 31 which is below the ground layer. The same situation then exists in compartment 32.

External electrical connections may be made to the system 10 either through connectors mounted on one or both of the covers 30 or via edge connectors on portions of the circuit board 100 which extend beyond the housing 30. Conductors which pass from the circuit zones within the housing through the shielding structure 130 to such an edge connector do so in the same way as the conductors 140 and 140a pass between the circuit zones 101 and 102 within the housing. Conductors extending to such an edge connector need not be restricted to a single signal layer.

A signal conductor which is particularly sensitive to either pick up of external signals or to the transmission of its signal to other conductors is shielded in a coaxial manner and is preferably located in one of the signal layers (111 or 112) which is adjacent to ground conductor 110. Conductor 150 of FIG. 3 in signal layer 111 is such a conductor. The width of conductor 150 is the same as that of other circuit board conductors which carry signals. Conductor 150 extends between two end points 152 and 153 both of which are in circuit zone 102. In the adjacent signal layer 113, a conductor 158 which is wider than conductor 150 extends parallel to conductor 150 and has its center line aligned with the center line of conductor 150. A plurality of holes 154 and 156 extend from the conductor 158 through the dielectric layers 123 and 121 to the ground conductor 110. The holes 154 are located on one side of conductor 150 and the holes 156 are located on the other side of conductor 150. Each hole 154 contains a conductive member or pin 155 and each hole 156 contains a conductive member or pin 157. Each of the conductive members 155 and 157 electrically contacts wide conductor 158 and ground conductor 110 but not narrow conductor 150. Conductive pins 155 and 157 form a conductive picket fence along each side of conductor 150. The holes 154 and 156 are spaced to position the conductive members (155 and 157) therein sufficiently close together to provide an effective shield at the RF signal frequencies at which coupling between conductor 150 and other circuitry must be prevented. The electrical connection of the conductive members 155 and 156 to the overlying wider conductor 158 and the underlying ground layer 110 provides a coaxial shielded structure in which the conductor 150 comprises the inner or center conductor and the conductor 158, conductive members 155 and 157 and ground layer 110 comprise the grounded outer (shield) conductor.

Although it is preferred that the coaxially shielded conductor 150 be located in a conductive layer adjacent to the ground conductor 110, if there are more than two signal layers on one side of the ground layer 110, then a similar coaxial shield structure can be provided for signal conductors in layers other than the outermost signal layer. This would involve two wide, shielding conductors like conductor 158, one of which would be disposed in the signal layer directly above the coaxially shielded conductor and the other of which would be disposed in the signal layer directly below the coaxially shielded conductor.

Enclosures in accordance with the present invention provide the benefit of large cover-to-ground-plane contact areas by virtue of the many conductive members or pins 136 which connect the ground layer 110 to the external surface shielding bands 132-13 and 132-14 and the large area contact between those shielding bands and the contact faces of the cover. This provides both good heat conduction and low electrical impedance ground connections.

A further benefit is the minimum length of conductors like 140 which extend from (in FIG. 1) isolated segment 21 (circuit zone 101) to isolated segment 22 (circuit zone 102) within the enclosure 12. The conductors 140 and 140a are completely shielded from external signals and do not require cable connections as required in prior art separate enclosure systems.

Additional techniques involving the configuration of the system segments incorporated within the enclosure 12 can aid in providing isolation between the compartments 31 and 32. One such technique is to connect each end of a conductor 140 or 140a which passes from one compartment to another to buffer circuits positioned to minimize the length of that conductor within each of the compartments. Such buffer circuits are preferably in the form of integrated circuits which are mounted to the circuit board 100 within the appropriate compartment.

The buffer circuit 172 (FIG. 3) on the transmitting end of conductor 140 provides a maximum amplitude (saturated) signal for the relatively high voltage state of a digital signal being transmitted and ground voltage for the relatively low voltage state of the digital signal. The maximum amplitude for the high voltage state prevents stray signals from within the source compartment from being transmitted to the receiving compartment as amplitude modulation on the digital signal which is intentionally transmitted between the compartments. The buffer circuit 172 may be any of a wide variety of well known circuits for re-establishing logic signal levels. Such circuits can include bistable circuits, amplifiers which provide a rigidly controlled maximum output voltage and so forth. The buffer circuit 174 on the receiving end of conductor 140 is clocked to establish the transitions of the received ditigal signal in accordance with the clock signals within the receiving compartment. In this way, any variation in the transition times of the transmitted digital signal which result from signals in the source compartment is eliminated prior to the distribution of that digital signal within the receiving compartment. This variation in the location-in-time of a transition in a digital signal (between a logical zero and a logical one) can be referred to a edge modulation. Both amplitude modulation and edge modulation are potential sources of signal leakage from one compartment to another. By the inclusion of sending and receiving buffers, these sources of leakage can be minimized or eliminated. If desired, the sending or drive buffer 172 may perform the reclocking function as well as the amplitude control function to prevent or minimize transmission of edge modulation into the receiving compartment. The receiving buffer may also perform both functions to provide double assurance that neither amplitude nor edge modulation originating in the sending compartment is distributed within the receiving compartment.

If reclocking is used to help in isolating RF signals in the two compartments, then the clock signal which is provided to the buffer circuit 174 is the one for the compartment in which the IC 174 is located. The buffer circuit 174 then reclocks signals on conductor 140 in accordance with that clock signal prior to distributing them within its compartment. The clock signals in the two compartments may be directly derived from the same clock signal or the clock signal in one compartment may be delayed relative to the clock signal in the other compartment. In either case, the reclocking buffer circuit is one which holds a received logic value until its next clock pulse at which time it provides that logic value at its output. In each clock cycle, this buffer receives one logic value at its input and provides the previously received logic value at its output.

Many electronic systems include more than two segments which need to be isolated from each other. Additional segments may be incorporated in an enclosure in accordance with the invention in several ways. More than two circuit zones may be provided within the circuit board 100 along with a corresponding number of recesses in the covers 30 (and corresponding contact faces on the covers 30) to provide a larger number of isolated compartments. Alternatively, rather than increasing the lateral dimensions of the circuit board 100, the spacing between the covers 30 may be increased and additional circuit boards and housing members may be added to the stack of enclosure components. Such an enclosure is illustrated generally at 12' in FIG. 6 in an exploded view and in FIG. 7 in an assembled view. The stack of components of enclosure 12' includes, from top to bottom in the FIGS. 6 and 7 a top cover 30, a circuit board 100, a separator housing member 40, a circuit board 200, another separator housing member 50, a circuit board 300 and a lower cover 30'. The top cover 30 and the circuit board 100 are like those in FIGS. 3 and 4.

The separator 40 includes an opening 41 in alignment with the first circuit zone 101 of circuit board 100 and two recesses or wells 32b and 42a separated therefrom by a cross-member 47. The recesses 32b and 42a are separated from each other by a wall or septum 44 and are in alignment with the second circuit zone 102 of circuit board 100. The opening 41 extends all the way through the separator 40 while the wall or septum 44 forms recess 32b which is open upward toward circuit board 100 and forms recess 42a (FIG. 7) which is open downward toward circuit board 200. The separator 40 has an upper contact face 46 having the same configuration as the contact face 36 of the cover 30. The circuit board 200 has two circuit zones 201 and 202 and a shielding structure 230 which is comprised of shielding bands 232, holes 234 and conductive members 236 configured in the same manner as the shielding structure 130 of circuit board 100.

The separator 50 has a configuration similar to that of the separator 40 with the exception that both of its sections 31b' and 42b have a wall or septum 54 forming upper and lower recesses and a cross member 57 which extends only upward from the wall 54 to form separate upward facing recesses 31b' and 42b which face the circuit board 200. A single downward facing recess 55a faces circuit board 300. The upper contact face 56 of the separator 50 conforms to the configuration of the shielding structure of the circuit board 200. The single downward facing recess 55a in separator 50 is substantially coextensive with the combination of the upward facing recesses 31b' and 42b in the upper surface of separator 50. The lower contact face 56' of the separator 50 is in the form of a rectangular annulus which is similar to a squared-off numeral zero. The circuit board 300 has a single circuit zone 301 and an isolation structure comprised of a shielding band 332 having the same general configuration as the lower contact face 56' of the separator 50. The lower cover 30' contains a single recess 55b which is aligned with the recess 55a in the lower surface of separator 50. The contact surface 36' of cover 30' is in the shape of a rectangular annulus and aligned with the shielding band 332 of the lower surface of the circuit board 300 and the lower contact face 56' of the separator 50. When assembled (FIG. 7) the enclosure 12' provides separate isolated compartments 31', 32, 42 and 51. The configuration of these compartments is best seen in the cross section view in FIG. 7. The compartment 31' differs from the compartment 31 of the enclosure 12 by being taller and incorporating both the first circuit zone 101 of circuit board 100 and the first circuit zone 201 of the circuit board 200. These two circuit zones may be connected to each other by wires 209. In this way, a system segment requiring more than one board for its fabrication may be enclosed within the compartment 31' and isolated from the other compartments. The compartment 32 of the enclosure 12' is identical to the compartment 32 of the enclosure 10 and incorporates the circuit zone 102 of circuit board 100 within it. The compartment 42 is located directly below the compartment 32 and is separated therefrom by the horizontal septum 44 of separator 40. The fourth compartment 51 incorporates the entire circuit zone 301 of circuit board 300 and is substantially twice the length of the compartments 31' and 32. The compartment 51 will accommodate a system segment which requires more circuit board area than can be enclosed within the compartment 32 but which does not require portions of two different circuit boards for its implementation.

Figure 6:
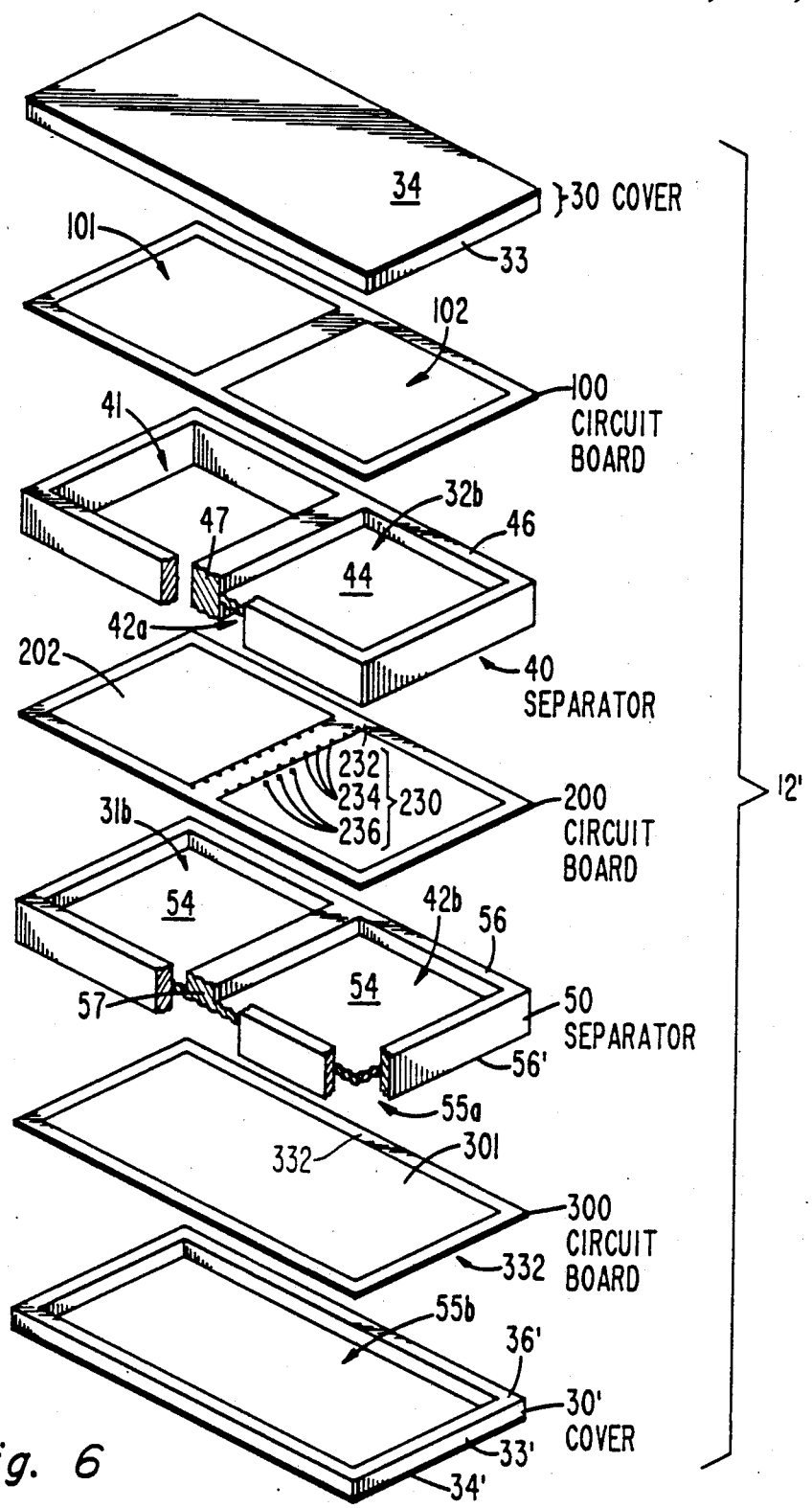
FIG. 6 is a perspective exploded view of a multiple circuit board system in accordance with the present invention.
Figure 7:
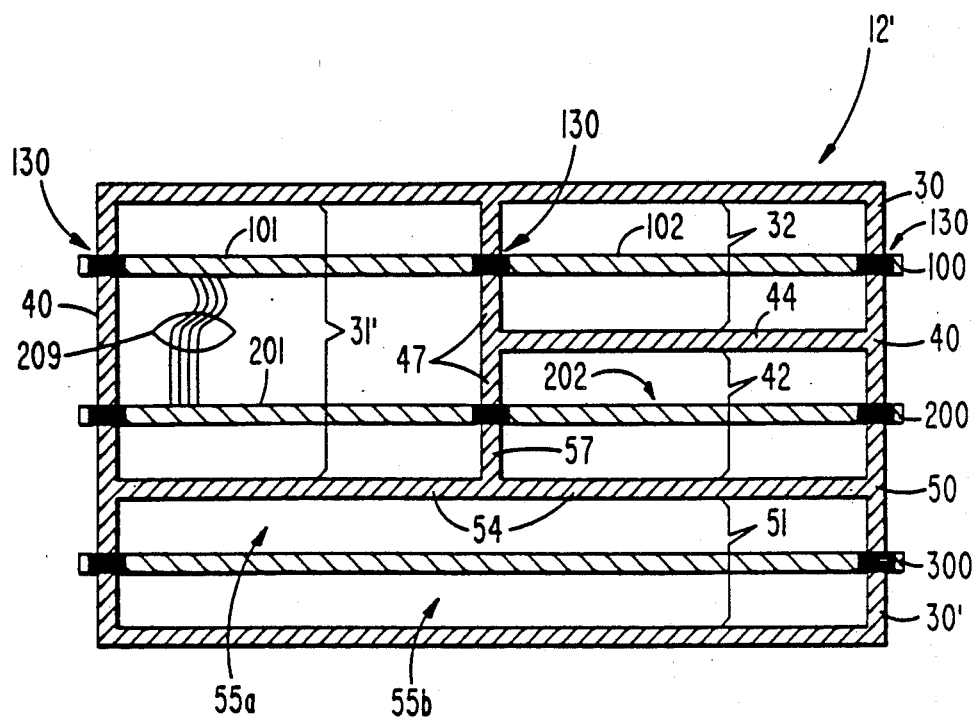
FIG. 7 is a cross-sectional view of the structure in FIG. 6 in assembled form.

The enclosure 12' of FIGS. 6 and 7 is illustrative of the manner in which the number of compartments in the enclosure can be increased by stacking separators and circuit boards. A compartment configuration suitable for substantially any system can be provided through the combination of stacking circuit boards and separators and providing additional recesses in covers and separators as needed. In the event that a particularly tall component is to be mounted in the compartment 31', a circuit board such as the circuit board 200 may extend only through the compartment 42 and not into the compartment 31', so long as the circuit zone of a single circuit board is sufficient for fabricating the system segment to be incorporated in compartment 31'. Such a circuit board which extends only part way through the structure would require modification of the housing members 40 and 50 so that their contact faces would meet each other where the circuit board was not present. Alternatively, a circuit board having a large hole therein having the same size as the circuit zone within the cavity 31' could be used. In that case the configuration of the contact faces of the separators 40 and 50 would be unchanged from those shown in FIGS. 6 and 7.

What is claimed is:

1. An electronic system comprising a multilayer circuit board having first and second opposed, laterally extending substantially planar major surfaces and a peripheral edge extending about the periphery of said circuit board, said circuit board including:
   a planar conductive ground layer, a plurality of circuit layers which comprise separate conductors in a predetermined pattern in a central circuit zone for controlling the path of RF signals and a plurality of dielectric layers interleaved with said circuit layers and said conductive ground layer to space said circuit layers from each other and said conductive ground layer; said dielectric layers, said conductive ground layer and said circuit layers each being disposed substantially parallel to said major surfaces;
   a shielding structure comprising:
      each of said circuit layers including conductive shielding border surrounding and circuit zone and spacing said circuit zone from said peripheral edge, the outermost layer of said circuit board at said first and second major surfaces being a circuit-layer; and
      a plurality of parallel, spaced conductive members each extending through said dielectric layers and electrically contacting said ground layer and said conductive shielding borders for holding said conductive shielding borders at the same electrical potential as said conductive ground layer and for forming an RF barrier surrounding said circuit zone.

2. The electronic system recited in claim 1 further comprising:
   an electrically conductive housing comprising first and second electrically conductive cover members disposed adjacent to said first and second major surfaces, respectively, of said circuit board;
   each of said conductive cover members having a substantially planar contact face aligned with and disposed in intimate electrical contact with said shielding border of said adjacent major surface;
   each of said cover members having a recess therein which is surrounded by said contact face thereof and aligned with said circuit zone; and
   means for securing said cover members and said circuit board in fixed relation.

3. An electronic system comprising a multilayer circuit board having first and second opposed, laterally extending substantially planar major surfaces and a peripheral edge extending about the periphery of said circuit board, said circuit board including:
   a planar conductive ground layer, a plurality of circuit layers which comprise separate conductors in a predetermined pattern in first and second central circuit zones for controlling the path of RF signals and a plurality of dielectric layers interleaved with said circuit layers and said conductive ground layer to space said circuit layers from each other and said conductive ground layer; said dielectric layers, said conductive ground layer and said circuit layers each being disposed substantially parallel to said major surfaces;
   a shielding structure comprising:
      each of said circuit layers including a conductive shielding border surrounding each of said circuit zones individually to space said circuit zones from each other and said peripheral edge, the outermost layer of said circuit board at said first and second major surfaces being a circuit layer; and
      a plurality of parallel, spaced conductive members each extending through said dielectric layers and electrically contacting said conductive ground layer and said shielding borders for holding said shielding borders at the same electrical potential as said conductive ground layer and for forming an RF barrier surrounding each of said circuit zones individually.

4. The electronic system recited in claim 3 further comprising:
   an electrically conductive housing comprising first and second electrically conductive cover members disposed adjacent to said first and second major surfaces, respectively, of said circuit board;
   each of said conductive cover members having a substantially planar contact face aligned with and disposed in intimate electrical contact with said shielding border of said adjacent major surface;
   each of said cover members having first and second recesses therein which are individually surrounded by said contact face thereof and aligned with said first and second circuit zones, respectively; and
   means for securing said cover members and said circuit board in fixed relation.

5. The system recited in claim 3 wherein:
   the ones of said first plurality of conductive members which comprise said RF barrier around said first circuit zone are disposed in a first straight line along at least a portion of the edge of said first circuit zone which is nearest to said second circuit zone;
   the ones of said first plurality of conductive members which comprise said RF barrier around said second circuit zone are disposed in a second straight line along at least a portion of the edge of said second circuit zone which is nearest to said first circuit zone;
   said first straight line is disposed substantially parallel to said second straight line; and
   said conductive members in said first line are spaced apart by substantially the same distance as said conductive members in said second line and offset therefrom so that an imaginary line disposed perpendicular to said first and second lines and extending through one of said conductive members in said first line substantially bisects the space between two adjacent ones of said conductive members in said second line.

6. The system recited in claim 3 wherein:
a first one of said circuit layers is the one adjacent to a first side of said conductive ground layer;
said shielding border of said first circuit layer has a first gap therein extending between two adjacent ones of said first plurality of conductive members at a first location selected for communication of signals between said first circuit zone and a region spaced therefrom by said shielding structure; and
a first one of said separate conductors extends from said first circuit zone to said region space therefrom by said shielding structure and is disposed in said first gap without contact to said shielding structure.

7. The system recited in claim 6 further comprising:
a plurality of integrated circuits mounted on said circuit board and conencted to selected ones of said separate conductors.

8. The system recited in claim 7 wherein said first separate conductor extends to said second circuit zone and said integrated circuits comprise:
a driver buffer circuit in said first circuit zone connected to said first separate conductor for driving said first separate conductor with digital signals having extreme amplitudes; and
a receiver buffer circuit in said second circuit zone connected to said first separate conductor for reclocking signals received therefrom.

9. The system recited in claim 8 wherein:
a second one of said circuit layers is the one adjacent to a second side of said conductive ground layer;
every one of said separate conductors which extends between either of said circuit zones and said region spaced therefrom by said shielding structure is disposed in either said first or second circuit layer.

10. The system recited in claim 7 wherein:
said first separate conductor extends to said second circuit zone;
a second one of said circuit layers is the one adjacent to a second side of said ground conductor;
said shielding border of said second circuit layer has a second gap therein extending between two adjacent ones of said first plurality of conductive members at a second location selected for communication of signals between said first and second circuit zones; and
a second one of said separate conductors extends from said first circuit zone to said second circuit zone in said second circuit layer and is disposed in said second gap without contact to said shielding structure; and
said integrated circuits comprise:
first and second driver buffer circuits connected respectively to a first end of said first and a first end of said second separate conductors for driving said separate conductors with digital signals having extreme amplitudes; and
first and second receiver buffer circuits connected, respectively, to a second end of said first and a second end of said second separate conductors for reclocking signals received therefrom.

11. The system recited in claim 10 wherein:
every separate conductor which extends between said first and second circuit zones is disposed in either said first or said second circuit layer.

12. The system recited in claim 1 wherein a first one of said circuit layers is adjacent a first side of said conductive ground layer and a second one of said circuit layers is adjacent said first circuit layer, and said system further comprises:
a first separate conductor disposed in said first circuit layer;
a second separate conductor wider than and extending parallel to said first separate conductor and disposed in said second circuit layer;
a second plurality of conductive members extending from said second circuit layer through the intervening dielectric layers to said conductive ground layer, each of said second plurality of conductive members electrically contacting said second separate conductor and extending therefrom past a first side of said first separate conductor without electrical contact thereto and into electrical contact with said ground layer;
a third plurality of conductive members extending from said second circuit layer through said intervening dielectric layers to said conductive ground layer, each of said third plurality of conductive members electrically contacting said second separate conductor and extending therefrom past a second side of said first separate conductor without electrical contact thereto and into electrical contact with said conductive ground layer;
said conductive members within each of said second and third pluralities being spaced to provide a barrier of conductive members within said intervening dielectric layers along said first and second sides of said first separate conductor, respectively, for RF shielding said first separate conductor, whereby said first seaprate conductor comprises the shielded inner conductor of a coaxial conductor system having a grounded outer conductor.

13. An electronic system comprising:
first and second multilayer circuit boards each having first and second opposed, laterally extending substantially planar major surfaces, each of said circuit boards including:
a planar conductive ground layer, a plurality of circuit layers which comprise separate conductors in a predetermined pattern in a first central circuit zone for controlling the path of RF signals and a plurality of dielectric layers interleaved with said circuit layers and said conductive ground layer to space said circuit layers from each other and said conductive ground layer; said dielectric layers, said conductive ground layer and said circuit layers each being disposed substantially parallel to said major surfaces;
a shielding structure comprising:
each of said circuit layers including a conductive shielding border surrounding said circuit zone and spacing said circuit zone from said peripheral edge, the outermost layer of said circuit board at said first and second major surfaces being circuit layers; and
a plurality of parallel, spaced conductive members each extending through said dielectric layers and electrically contacting said conductive ground layer and said conductive shielding borders for holding said conductive shielding borders at the same electrical potential as said conductive ground layer and for forming an RF barrier within each of said dielectric layers surrounding said circuit zone;

an electrically conductive housing comprising first and second electrically conductive cover members and an electrically conductive separator member interleaved with said first and second circuit boards in the order: first cover member, first circuit board, separator, second circuit board, second cover member;

each side of each of said conductive housing members which is disposed adjacent to one of said circuit boards having:
- a substantially planar contact face aligned with and disposed in intimate electrical contact with said shielding border of the adjacent major surface of said adjacent circuit board, and
- a recess therein surrounded by said contact face thereof and aligned with said circuit zone; and means for securing said housing members and said circuit board in fixed relation.

14. The electronic system recited in claim 13 wherein said first circuit board further comprises a second circuit zone laterally spaced from said first recited circuit zone thereof and wherein:

said shielding borders of said first circuit board surround each of said circuit zones thereof individually; and said RF barrier formed by said first plurality of conductive members of said first circuit board surrounds each of said circuit zones individually.

15. The electronic system recited in claim 14 wherein:
said first cover member and the side of said separator member toward said first circuit board each have first and second recesses therein, each surrounded by said contact face thereof and aligned with said first and second circuit zones of said first circuit board, respectively.

16. The electronic system recited in claim 15 wherein: said recess in said separator member which is aligned with said first circuit zone of said first circuit board comprises an opening extending completely through said separator member and said system further comprises:

at least one conductor connecting said first circuit zone of said first circuit board to said circuit zone of said second circuit board.

17. The electronic system recited in claim 13 wherein each of said circuit boards further comprises a second circuit zone laterally spaced from said first recited circuit zone thereof and wherein in each of said first and second circuit boards:

said shielding borders surround each of said circuit zones individually and space them apart; and said RF barrier formed by said first plurality of conductive members surrounds each of said circuit zones individually.

18. The electronic system recited in claim 17 wherein:
said first cover member and the side of said separator member toward said first circuit board each have first and second recesses therein each individually surrounded by said contact face thereof and aligned with said first and second circuit zones of said first circuit board, respectively; and said second cover member and the side of said separator member toward said second circuit board each have first and second recesses therein each individually surrounded by said contact face thereof and aligned with said first and second circuit zones of said second circuit board, respectively.

19. The electronic system recited in claim 18 wherein:
said first circuit zones of said first and second circuit boards are aligned; and said recesses in said separator member which are aligned with said first circuit zones comprise an opening extending completely through said separator member whereby said first circuit zones are enclosed in a single compartment of said housing.

* * * * *